United States Patent [19]  [11]  4,165,270
Ost et al.  [45]  Aug. 21, 1979

[54] CIRCUIT INTEGRITY TESTER

[75] Inventors: Robert J. Ost, Great Neck; Robert F. Perry, Patchogue, both of N.Y.

[73] Assignee: Sperry Rand Corporation, New York, N.Y.

[21] Appl. No.: 942,099

[22] Filed: Sep. 13, 1978

[51] Int. Cl.² .................. G01N 27/00; G01R 31/08
[52] U.S. Cl. .................. 204/195 R; 204/1 T; 324/52; 324/73 PC
[58] Field of Search ............ 204/1 T, 195 R; 324/52, 324/51, 29, 73 PC

[56] References Cited
U.S. PATENT DOCUMENTS

| 3,493,481 | 2/1970 | Messner et al. | 204/180 |
| 3,494,837 | 2/1970 | Messner et al. | 204/1 T |
| 3,824,462 | 7/1974 | Vinsani | 324/73 PC |
| 3,830,956 | 8/1974 | Wootton et al. | 324/51 X |

Primary Examiner—G. L. Kaplan
Attorney, Agent, or Firm—Howard P. Terry

[57] ABSTRACT

The test device is an electrolytic apparatus for the simultaneous non-destructive testing of the integrity of pluralities of circuit boards for continuity and anti-continuity or short circuits, including such circuit boards as employ multi-layer or multi-level interconnection wiring, whether it be printed wiring or screen printed or thermally deposited circuits. Transient electro-deposition of one ion from an alkali halide water solution temporarily modifies the optical reflectivity of exposed circuit terminals or metal parts of the circuit boards under test in a characteristic and easily recognized manner according to the continuity status of the associated circuit paths.

13 Claims, 8 Drawing Figures

CIRCUIT INTEGRITY TESTER

BACKGROUND OF THE INVENTION

1. Field of the Invention

The present invention relates generally to electrolytic test apparatus for the examination of the perfection of miniature circuits and, more particularly, relates to electrolytic apparatus for the non-destructive testing of the continuity of such circuits by visual observation of distinctive patterns of varying optical reflectivity of terminals or other electrical parts of such circuits.

2. Description of the Prior Art

Procedures used in the past for testing circuit boards have been of two general kinds. One procedure has involved very careful visual control during each step in the manufacture of the circuit board, followed by point-to-point electrical probe testing, often just after each layer of metal is deposited on the growing structure and at the end of the manufacture according to a program dictated by the nature of the circuit board itself. Such point-to-point testing is aided by conventional apparatus using a visual or auditory alarm and requiring that two electrical probes be used between the various possible combinations of electrical terminals in each circuit supplied for continuity testing and particularly to the various circuit points adjacent metal layers crossing in close proximity over or under circuit nodal points under test for short circuit faults. However, in multiple layer circuits, it generally proves impractical to perform manual point-to-point tests of all possible combinations because only one such multiple layer circuit may be tested at a time. As a consequence, reliance is placed upon testing multiple layer circuits selected as samples, with the attendant high risk of other multiple layer circuits escaping the presumably statistical sampling process and thus going on for incorporation in higher order and very expensive assemblies. While the dual probe test method is sometimes considered to be adequate for use in the development laboratory on a given sample, it is not satisfactory as a reliable method for use in production testing.

A known alternative to the point-to-point manual testing system is a test system designed to operate cooperatively with a digital computer. Here, the computer is programmed to test all of the foregoing possible combinations of short and open circuits. In addition to generation of the required program, a costly interface probing tool must be generated and used to provide the computer with access to all terminals or other points of significance in the entire circuit to be tested. The number of probes that must be located precisely in the probing tool often amounts to 500 to a 1000. This interface tool or multi-probe fixture and the program must generally be changed each time the circuit type to be tested is changed unless the strictest standarization of design is maintained. This type of integrity tester finds a degree of utility in mass manufacture where designs are not altered, but lacks flexibility otherwise. The expense of setting up the device where even moderately spaced apart changes are made in the circuit design is prohibitive.

SUMMARY OF THE INVENTION

The present invention relates to electrolytic apparatus for the non-destructive mass testing in the laboratory or factory of pluralities of circuit boards for the presence of circuit abnormalities, especially in multi-layer boards which form high-density microelectronic packages, and including circuit layers made by the screen printed process, for instance. A plurality of circuit boards to be tested, including one known to be without flaws, is immersed in an alkaline iodide solution in precise mechanical alignment. The circuit boards being so aligned, electrode probes in an array of probes are each brought into contact with a predetermined terminal or nodal point associated with a respective one of the aligned circuit boards. A pulsed voltage supplied to each of the electrode probes causes disassociation of the iodine from the solution and its deposition on exposed circuit points or terminals to which the pulsed voltage is applied by the probes. The pulsed current path is completed by an anode grid lying in the solution below the array of circuits to be tested.

The consequent deposition of iodine on the exposed circuit points (terminals, et cetera) provides a readily apparent contrast in color as compared to the appearance of the unenergized circuit points, so that a visual appraisal may be made of the circuit boards undergoing tests in comparison with the appearance of the good reference sample to determine the presence of deviations from the reference pattern. Should a deviation be seen in one of the circuits under test, the source of the deviation is ascertained as follows:

1. a short circuit exists should the circuit with a deviation have more circuit points on its surface that are in apparent color contrast with respect to the scene on the reference circuit surface or if the contrasting pattern differs from that of the reference, or
2. an open circuit exists in the circuit should it have fewer contrasting circuit points than the reference.

The invention overcomes the difficulties of the known prior art system in providing a relatively inexpensive test apparatus of flexible nature, being useful both in the laboratory and in the factory. Consumption of operating time is reduced over that required in the dual probe method and the great expense of the computer-controlled method is obviated.

DESCRIPTION OF THE PREFERRED EMBODIMENTS

Figure 1:
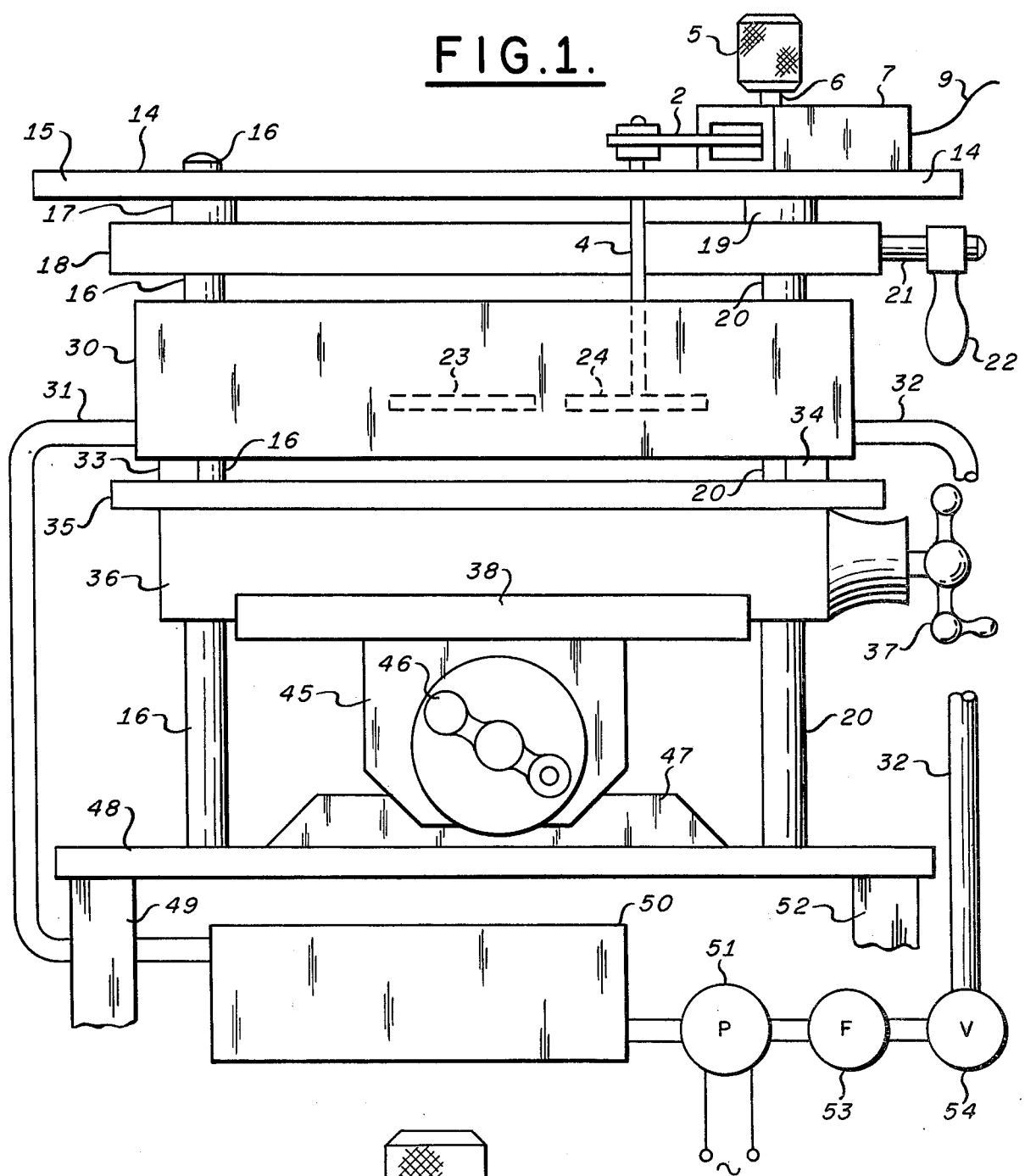
FIG. 1 is an elevation view illustrating the primary mechanical features of the test apparatus.

In FIG. 1, a general view of cooperating parts is presented that are used simultaneously to position one or more circuits to be tested, to immerse them simultaneously in an electrolyte, and then to effect simultaneous or individual tests of the circuits. The assembly of parts is mounted on a substantially level bench top 48 supported by legs 49, 52 at a convenient operating height. Bench top 48 supports a base element 47 and a first mobile carriage 45 which may be translated horizontally in or out of the drawing by operation of a lead screw mechanism manually adjustable by rotation of hand wheel 46 in a manner similar to the operation of conventional machine tool carriage translators. Similarly, a base element 38 is mounted across carriage 45 so that a second mobile carriage 36 may be translated horizontally at right angles to carriage 45 by the operation of a second lead screw mechanism manually adjustable by rotation of hand wheel 37.

Upon the upper carriage 36 is mounted a convenient platform 35 for affixing the electrolytic test tank or container 30, as will be described in more detail in connection with FIGS. 2 and 3. Container 30 provides the arena in which tests of a plurality of circuits such as circuits 23, 24 may be made when electrode probes such as probe 4 are caused to contact circuit elements of circuits 23, 24. In making the tests, an electrolyte is continuously and gently circulated from the lower reservoir 50 by electric motor driven pump 51 through filter 53, valve 54, and flexible conduit 32 into test container tank 30. From tank 30, the electrolyte is allowed to flow through flexible conduit 31 by gravity back into reservoir 50. Filter 53 may be a conventional filter of the kind widely used in automotive circulatory systems and valve 54 may act as a throttle valve, controlling the magnitude of flow of electrolyte through test container 30.

Figure 4:
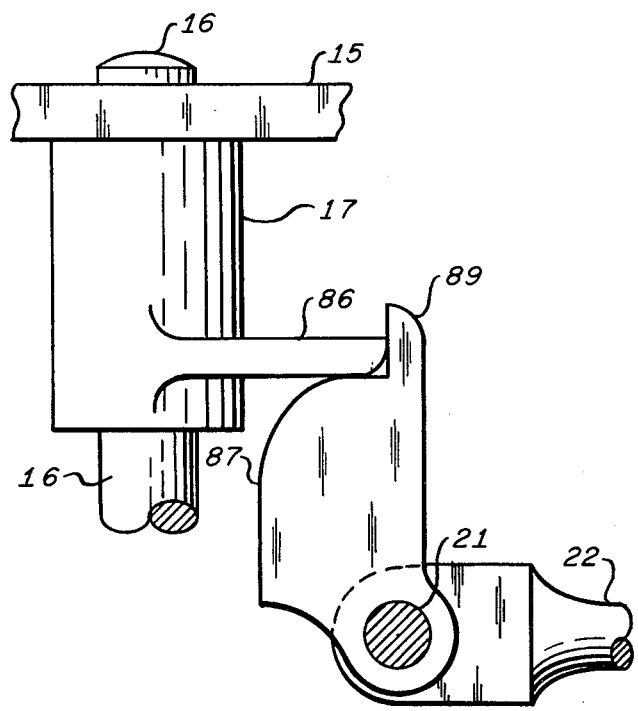
FIG. 4 is a fragmentary elevation view of a portion of the probe engagement control of FIG. 1.

A suitable planar support 15 is disposed horizontally for supporting probes 4 with respect to test container tank 30 and more particularly with respect to the circuits 23, 24 to be tested within tank 30. As thus supported, probes 4 will also be maintained in fixed relation to each other. For this purpose, the horizontal planar support 15 may be raised or lowered by a mechanism contained in casing 18. By this means, contact between probe 4 and circuit 24 is made or broken, as desired. As seen in FIG. 1, casing 18 is affixed, for example, to the pair of vertical rods 16, 20 fastened, in turn, to bench top 48. Referring to FIGS. 1 and 4, each rod 16, 20 is supplied with a corresponding bearing element 17, 19 through which, in the case of bearing element 17, for example, rod 16 passes, the bearing element 17 being affixed to the bottom surface of planar horizontal support 15. Bearing element 17 is provided with a boss 86 contacting a manually rotatable cam 87 having a stop 89. Cam 87 may be rotated by grasping handle 22 and rotating the shaft 21 found in casing 18 (not shown in FIG. 4). Since shaft 21 rotates in journals fixed with respect to vertical rods 16, 20, cam 87 permits the support plane 15 in one instance to assume a low position as in FIG. 1, whereby all probes such as probe 4 touch circuit 24 or a corresponding circuit. In a second instance, with cam 87 in the position shown in FIG. 4, bearing element 17 is raised so that planar support 15 is at its maximum elevation. A similar cam configuration may be associated with bearing element 19 and rod 20.

It will be understood that planar support 15 has a large rectangular opening, as indicated at 14, 14 in FIG. 1, so that the plurality of electrode probes 4 may be passed through opening 14 into test tank 30 to contact the circuits to be tested.

Figure 1A:
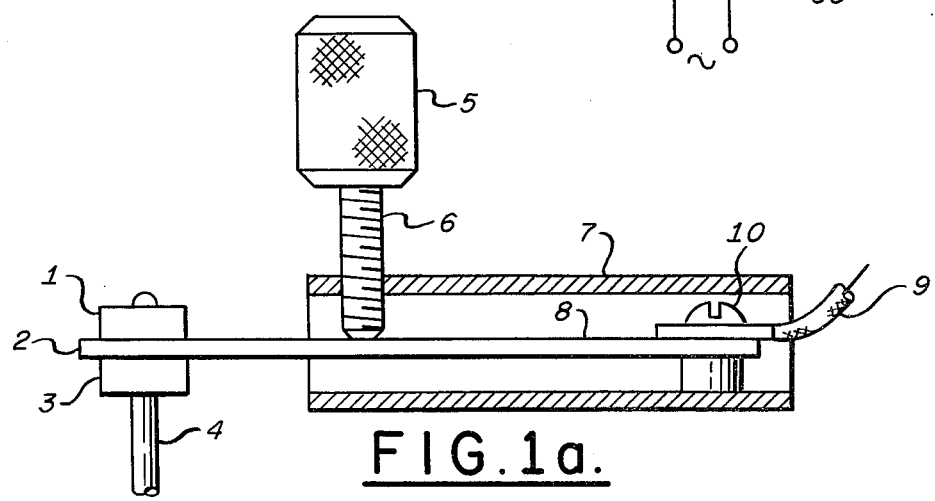
FIG. 1A is an enlarged elevation cross section view of a probe holder also illustrated in FIG. 1
Figure 5:
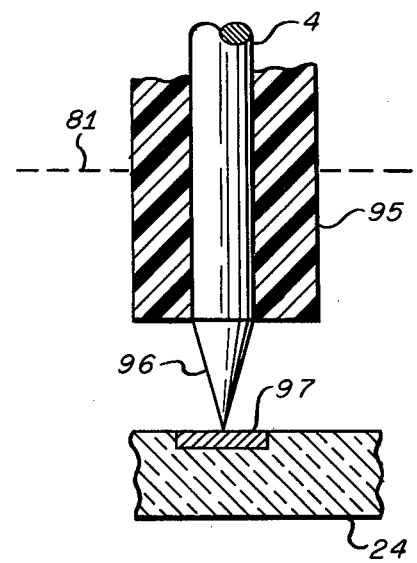
FIG. 5 is a cross section view of one of the electrode probes such as seen in FIG. 1.

Only one of the probes 4 is shown in position in FIG. 1, while FIGS. 1A and 5 respectively show further details of typical probe holders 7 and probes 4. In the simple form of probe holder shown in FIGS. 1 and 1A, the electrode probe 4 is clamped by suitable fasteners 1, 3 where it projects through a hole in one end of a biased leaf spring 8. The opposite end of leaf spring 8 may be affixed to the casing of the probe holder 7 by a screw fastener 10 designed in the conventional manner to isolate electrically the spring 8 and lead 9 from the casing; this is required because the leaf spring 8 forms part of the electrical path between probe 4 and the output lead 9. A screw 5 having a threaded portion 6 is used as a fine control of the vertical location of the probe 4. The probe holder 7 may be itself heavy enough to stay reliably in place on planar support 15 or its reliable location may be more fully assured by magnetizing it. In any event, suitable devices for holding the probe 4 are readily available on the market. As in FIG. 5, the end 96 of probe 4 may be made conical and the region of probe 4 above conical part 96 and exposed to the electrolyte below level 81 may be covered with a plastic protective tube 95.

FIG. 5 illustrates the conical probe end 96 as contacting a typical gold, silver, or platinum-gold part 97 of a circuit 24 found associated with a typical insulating substrate. The probe 4 material is preferably a corrosion resistant spring metal, being of the type generally marketed for test use by the microcircuit equipment industry and which does not tend to slip off the circuit area to be tested.

Figure 2:
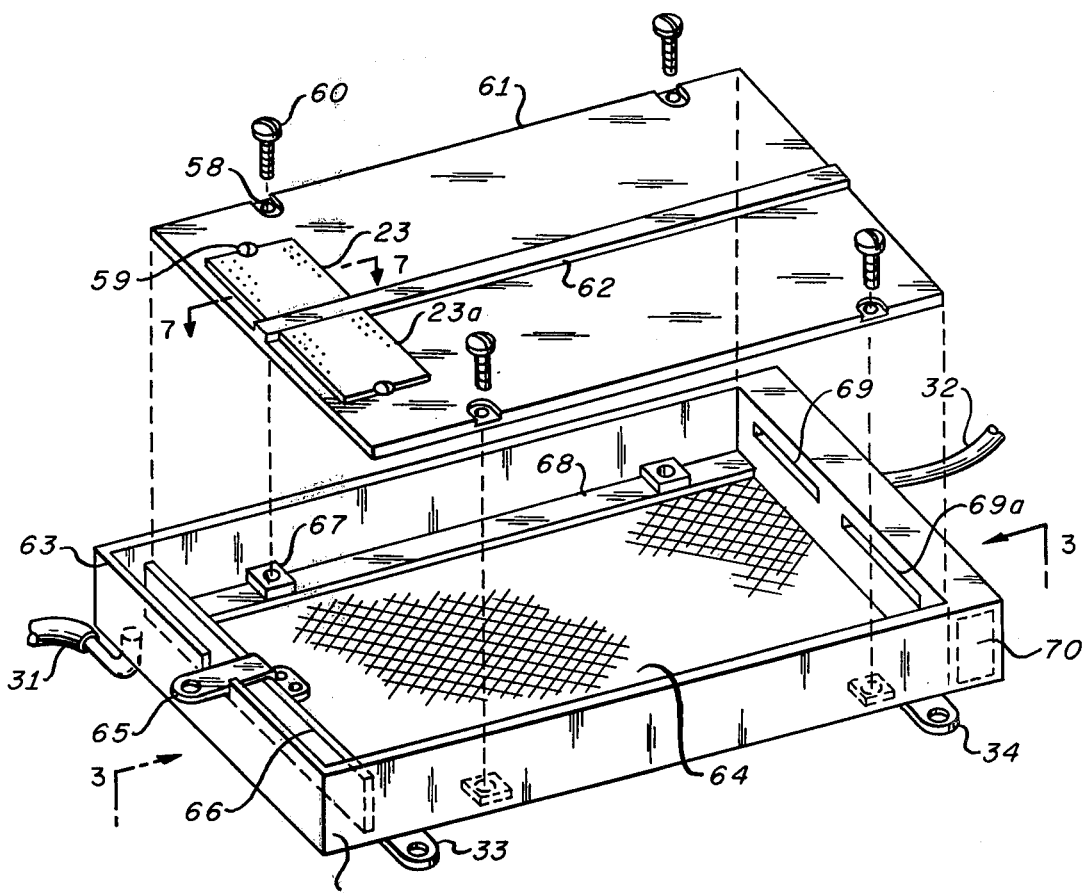
FIG. 2 is a perspective exploded view of the test tank electrolyte container and circuit holder tray of FIG. 1.
Figure 3:
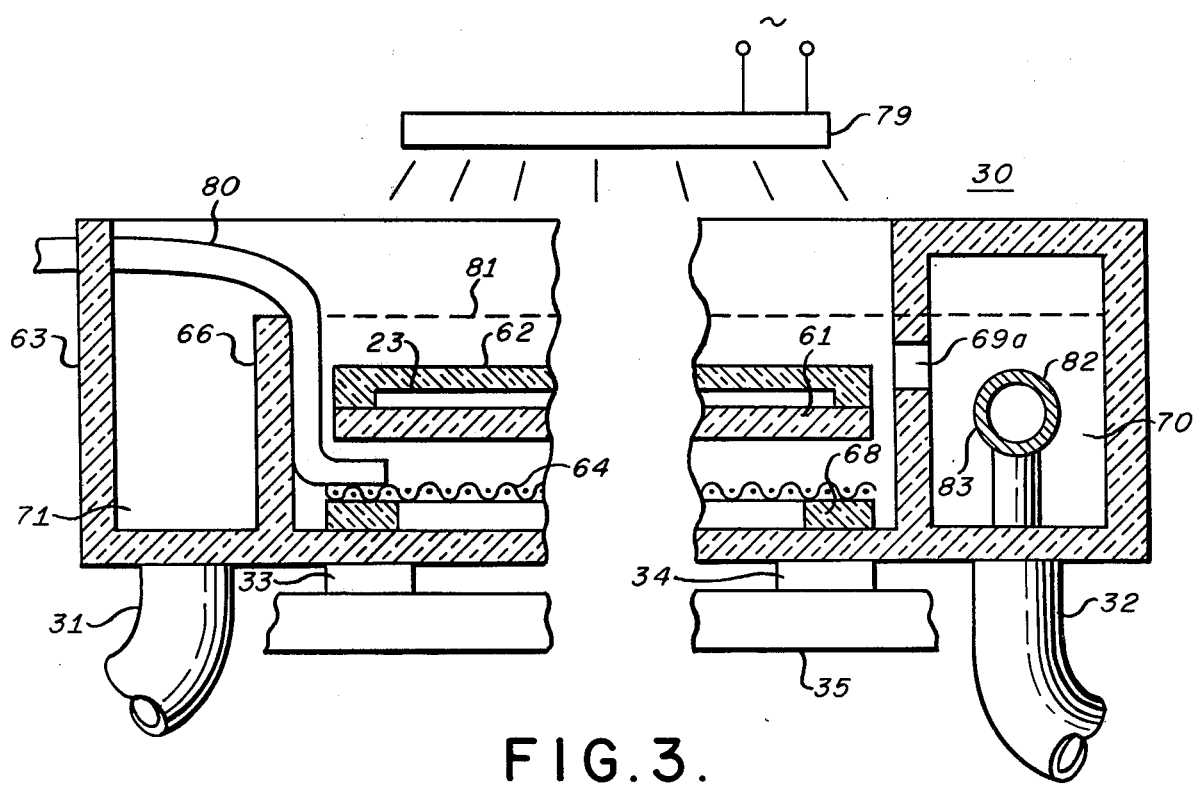
FIG. 3 is a fragmentary cross section view of the container taken along the line 3—3 of FIG. 2.

Forms of the open-faced rectangular container 30 in which the circuits 23, 24 are tested are illustrated in more detail in the exploded view of FIG. 2 and in FIG. 3. Tank 30 may be molded of a plastic material or otherwise constructed of an electrically insulating material that is preferably transparent. It is supplied with tabs such as tabs 33, 34 at its base for affixing it with suitable fasteners as in FIG. 1 to the manipulator platform 35 for translation in either of two mutually perpendicular horizontal directions, as will be further described. A rectangular frame 68 or tray is placed at the bottom of test tank 30, and holds taut a screen or grid 64 which functions as an anode grid for the system. The frame 68 and anode 64 may be affixed at a level adjacent the bottom of test container tank 30 by suitable fasteners, such as by screws like screw 60 passing through holes 58 into respective threaded bosses such as that seen at 67. The anode 64 has a convenient conductive anode lead 65 which passes over the tank partition 66 and over outer wall 63 for connection with electrical control equipment yet to be described. Anode 64 may be constructed of platinum-coated or platinized titanium to prevent its corrosion by electrolytes such as potassium iodide; less expensive forms of anode 64 may be made of a mesh of stainless steel. Such devices are commercially available from electroplating materials suppliers.

The circuits to be tested are placed on a horizontal surface consisting of a tray-like holder 61 of plastic material. Holder 61 fits into tank 30 with suitable clearance so that it rests on bosses such as boss 67, for example, just above anode screen 64. Plastic holder 61 is designed to mount and to retain the circuits to be tested, only two of which are shown in FIG. 2 at 23 and 23a. The circuits under test are urged against a median ridge or stop 62 extending longitudinally at the upper surface of holder 61. Each circuit is held firmly against one side of ridge stop 62 by a pin or screw 59 inserted in predetermined holes in the holder 61 at the sides of the circuits opposite ridge stop 62. Each circuit is illuminated by a light source 79 (FIG. 3) during the test event. It will be readily understood that the arrangement of fasteners 59 is designed to hold the circuits to be tested in a known fixed relation with respect to the ends and sides of test container 30 and with respect to each other. As those skilled in the art will readily perceive, other ways of fastening circuits 23, 23a with respect to the test container tank 30 may readily be practiced within the scope of the present invention.

The system for circulating an electrolytic fluid through test container 30 at a level 81 above the top surface of circuits 23, 23A, 24 will be understood by reference to FIGS. 1, 2, and 3. A covered plastic reservoir 50 contains a generous supply of the electrolyte solution for circulation through the test container 30. It is circulated by a conventional electric-motor-driven pump 51 through filter 53 and regulator valve 54 into test container 30, as previously noted.

Referring particularly to FIG. 3, the electrolyte is forced through valve 54, which will normally be a throttle valve capable of adjusting actual rate of flow of the liquid, and conduit 32 into an inlet volume 70 of the test tank 30 in the form of a liquid distribution plenum having one or more horizontally slotted openings 69, 69a facing the open test region of test tank 30. The liquid flowing in conduit 32 may be distributed uniformly within plenum 70 by a tee-shaped pipe 82 having a plurality of openings, such as the radial bore 83.

In this manner, the liquid flows at a gentle rate over any immersed circuit 23 supported on holder 61, the liquid level substantially at the dotted line 81 being determined by the height of the plastic weir 66 at the end of test container 30 opposite input plenum 70. The electrolyte constantly flows over weir 66 into a collection chamber 71, where it is removed via conduit 31 by gravity flow, for example, into reservoir 50 of FIG. 1. Filters may be placed in both the input and output conduits of reservoir 50, if desired. Conduits 31, 32 are flexible so as to permit motion of test container 30 relative to the fixed reservoir 50 and its associated fixed elements 51, 53, 54 for purposes yet to be described. It will be apparent to those skilled in the art that other modifications of the illustrated pump-reservoir system may readily be suggested falling clearly within the scope of the present invention.

Figure 6:
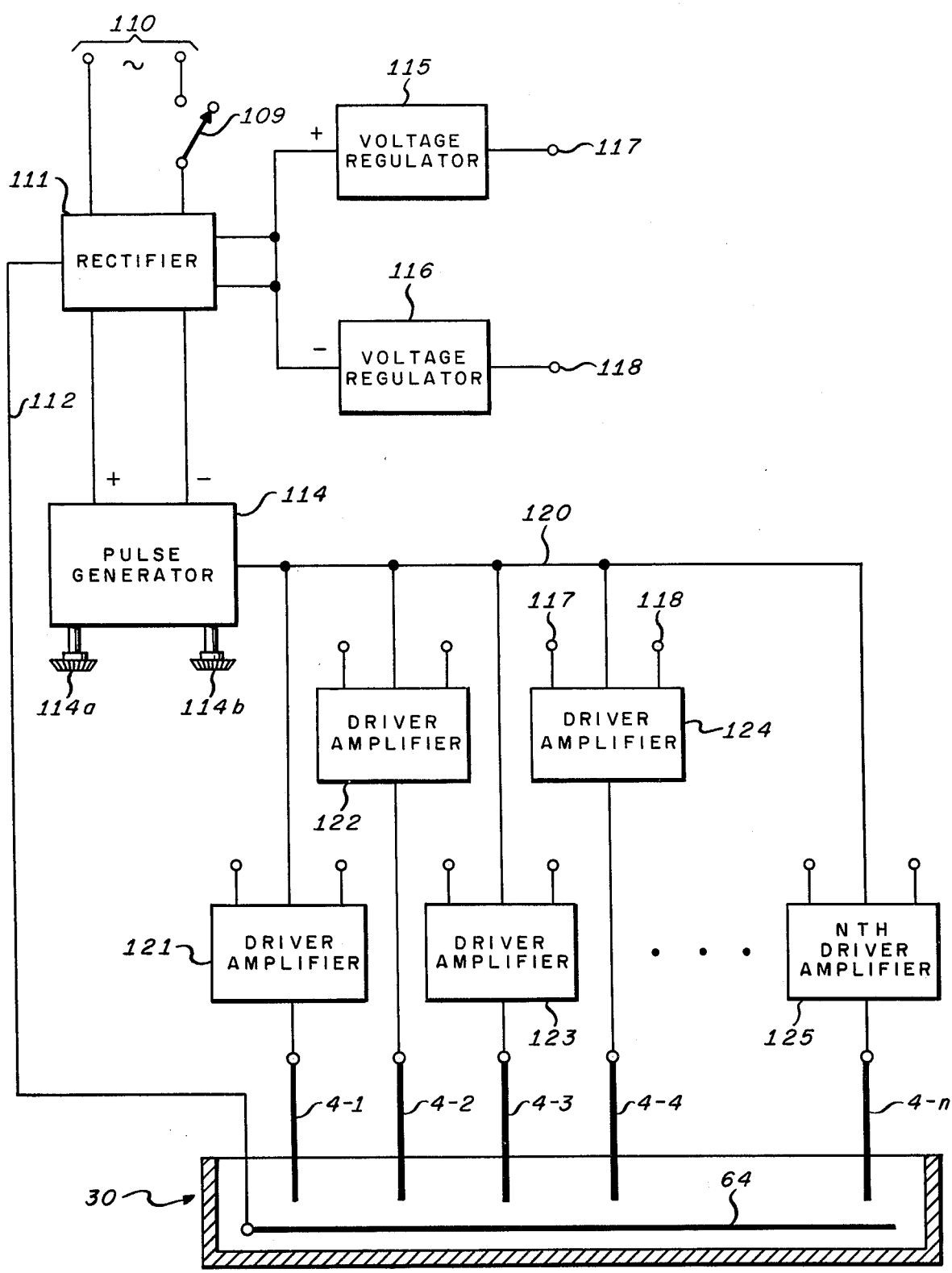
FIG. 6 is a wiring diagram of the electrical circuits associated with the mechanical system of FIG. 1 and the plural electrode probes, showing electrical components and their interconnections.

FIG. 6 illustrates a preferred form of the electrical circuits used to excite probes 4 and anode 64. Alternating current from a convenient supply (not shown) attached to terminals 110 readily causes the conventional rectifier 111 to generate the positive and negative unidirectional voltages required for the test set. For example, rectifier 111 supplies substantially equal positive and negative voltages to pulse generator 114. The latter device is a conventional pulse train generator and pulse width modulator adapted to produce pulse trains symmetric about zero volts. The pulse frequency of the train is adjusted by manual control 114a, while the duty cycle is adjusted using manual control 114b. A repetition frequency between 0.5 and 5 cycles per second is selected to provide adequate visual comfort for the observer. Duty cycle ratios are normally selected between 10 and 50 percent, since significant undesirable etching of the metal conductors of the circuit may occur above the 50 percent limit, depending upon the metal used in the circuit under test. Voltage amplitude is set, for example, at 10 volts peak-to-peak.

The pulse train output of pulse generator 114 is coupled by bus 120 in parallel to a plurality n of similar conventional current limiting driver amplifier circuits 121, 122, 123, 124 . . . 125, one for each of the n probes 4-1, 4-2, 4-3, . . . , 4-n employed. The test circuit is completed through the circuit or circuits under test, the electrolyte, anode 64, and return lead 112 when switch 109 is closed. The regulated positive and negative voltages generated by voltage regulators 115, 116 are respectively coupled to power each of the driver amplifiers, such as via terminals 117, 118 seen also as inputs to the representative corresponding terminals 117, 118 of the typical driver amplifier 124. The voltage regulators 115, 116 while conventional in themselves, maintain the supply voltage substantially constant over variable load conditions as, for example, those reflecting the presence of a short circuit in the circuit under test.

The electrolyte is, for example an approximately one molar solution of an iodide salt such as potassium iodide dissolved in deionized water. When a circuit 24 is immersed in such a flowing solution and an electrically excited probe 4 is in contact with the surface of a conductor 97 of the circuit 24, iodine is deposited on alternate half cycles of a first polarity on the conductor surface and is washed away because of the electrolyte flow from the conductor surface during the intervening half cycles of opposite polarity. With the relatively low repetition rate employed (0.5 to 5.0 cycles per second) a "blinking" or "flashing" effect is observed with light 79 operated continuously. It will be understood that the iodine normally washed off of the circuit conductors will be collected by filter 53 so that the electrolyte remains clear and useful over an extended period of time.

Figure 7:
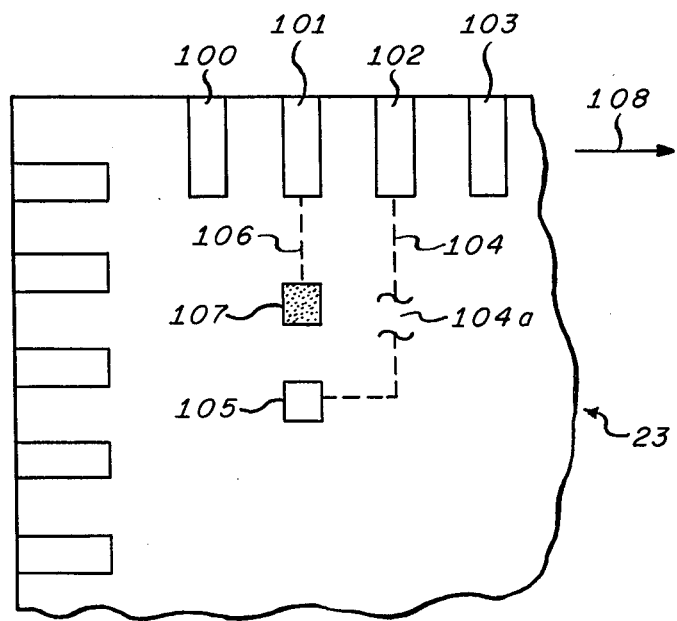
FIG. 7 is a top view of a portion of a typical circuit board which may be tested using the present invention; in what follows, the word "circuit" and the phrases "test circuit" or "circuit to be tested" will be understood in a broad sense to include circuit boards of the kind found on or in dielectric or electrically insulating intermediate layers or substrates to be used in single or multiple layer circuit assemblies.

In operation, the circuits 23, et cetera, to be tested as seen in FIG. 7 are placed with their terminals or test points upward on holder tray 61; usually nine or more presumably identical circuits 23 are put in place, along with a tenth circuit known to be good so that it serves as a test model. All circuits are pressed in a regular array as shown in FIG. 2 against the median ridge stop 62 and are clamped in place by fasteners 59. One electrode probe holder 7 and its corresponding probe 4 is positioned above the same starting point on each respective circuit, such as a circuit terminal 100 (FIG. 7) for each of the array of circuits. The probe engagement control lever 22 is rotated to lower the array of probes so that they now each contact a respective circuit terminal 100 of each circuit. Switches are closed to start the fluid circulating pump 51 and for activating power supply elements 111, 114, thus activating the probe array and the anode 64 and anode circuit 112.

The potassium iodide solution has by this time filled test container tank 30 to the top of weir 66, thereby immersing the circuits to be tested, and is flowing back into reservoir 50. Controls 114a, 114b are adjusted to optimize visual color contrast. With the probe array electrically activated, the operator visually compares the number of points on the circuits being tested with the number of points visually contrasting on the reference circuit, noting discrepancies. A second check is made to see that the patterns of the tested circuits are all the same as far as location of the contrasting points is concerned as in the pattern of the reference circuit.

Assuming that the test with respect to all of the circuit terminals 100 is completed, the probe engagement control lever 22 is operated to raise the probes out of contact with terminals 100. Now, the container or tank 30 and consequently the array of circuits under test is moved incrementally and horizontally as indicated by arrow 108 in FIG. 7 by operation of horizontal translator 37, 46, so that the probes are now above the array of circuit terminals 101. The same tests are again made after the probes are lowered on terminals 101; similar successive translations and tests are then caused, completing tests of the array of circuits associated with terminals 100 through 103, et cetera.

When the test is made at terminal 101 and if, for example, there is buried a conductive path 106 between terminal 101 and a conductive test point 107 on the exposed surface of the reference circuit, all tested circuits, like the reference circuit, should show pulsating iodine deposition on test point 107, indicating the desired state of continuity. If the reflectivity of such a point 107 does not pulse, the circuit path 106 is defective. On the other hand, if a test is made by moving the probes by translator 37, 46 to the array of circuit terminals 102 and if, for example, there is an undesired open circuit 104a in one of the buried otherwise conductive paths 104, point 105 of the defective circuit will stay highly reflective, while points 105 of good circuits will demonstrate alternating or pulsing reflectivity. It is apparent that undesired shorts between current paths 104, 106 may also be easily discovered. It will also be observed that similar test sequences may be used with conducting or nodal points such as points 105, 107 on the surfaces of pluralities of circuits to be tested and that they may be examined for the presence of undesired open or short circuits simply by placing the probe array over the plurality of points 105, for example, using positioners 37, 46, making the necessary contacts, and observing the presence or absence of pulsating changes in the reflectance of the circuit metal surfaces as compared to the condition of a standard model. If one of the conductive points such as points 105, 107 or if one of the terminals 100 to 103, et cetera, happens to be a nodal point common to a circuit having branching conductive or other paths to one or more such conductive points on terminals found on the face of circuit 23, those other points on terminals will indicate the corresponding continuity state of the paths by exhibiting a particular characteristic pulsed reflectivity. It will also be evident that the faulty circuits may then readily be discarded or repaired, as the economics of the situation dictate, before they are incorporated in expensive assemblies.

Accordingly, it is seen that the present invention provides an inexpensive and flexible arrangement for testing circuit boards. The apparatus may be used for discovering fabrication faults in mass-produced electrical multi-layer structures, for example, using unskilled operators with reasonable eyesight, and is also readily and inexpensively adapted to revision for the test of developmental revised or even significantly modified circuit designs.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. An apparatus for testing continuity of and detecting short circuits of the conductors of a plurality of identical circuit boards wherein the circuit boards are immersed in a liquid solution from which a constituent thereof may be induced to separate onto an electrical conductor immersed therein through the application of a voltage between the conductor and the solution, comprising:

container means for containing the liquid solution, holding means for positioning a plurality of the circuit boards in the solution and aligned in fixed relation to each other, a plurality of electrodes, each for applying a voltage to a conductor of a respective one of the circuit boards, support means for supporting said electrodes in fixed relation to each other, adjustable means for effecting translational motion of said support means with respect to said holding means, and means for applying a voltage between the solution and said electrodes such that said electrodes may be simultaneously positioned to contact corresponding conductors of the circuit boards to indicate electrical continuity and to detect short circuits thereof through observation of the separation of the constituent onto the conductors so contacted.

2. The apparatus of claim 1, wherein said support means is positioned above said holding means, and said adjustable means comprises first means for effecting vertical motion between said holding means and said support means and second means for effecting horizontal translational motion between said holding means and said support means.

3. The apparatus of claim 2, wherein said second means comprises first horizontal adjustment means for effecting horizontal motion of said holding means with respect to said support means in a first direction and second horizontal adjustment means for effecting horizontal motion of said holding means with respect to said support means in a second direction normal to the first direction of said first horizontal adjustment means.

4. The apparatus of claim 3 wherein said first and second horizontal adjustment means comprise lead screw mechanisms.

5. The apparatus of claim 1 wherein said holding means includes stop means on a broad surface thereof against which said plurality of circuit boards are abutted in fixed regular relation before immersion in said liquid solution.

6. Apparatus as described in claim 1 further including:

pump means, and plenum means coupled to said pump means for directing a uniform flow of the liquid solution through said container means over the miniature circuits.

7. Apparatus as described in claim 1 further including collector means opposite said plenum means for determining the height of the liquid solution above the circuit boards and for returning said liquid solution to said pump means.

8. Apparatus as described in claim 1 further including means for circulating the liquid solution through said container means and including:

reservoir means for the liquid solution, pump means coupled to said reservoir means, distributor means responsive to said pump means for inducing a uniform flow of the liquid solution through said container means, and collector means opposite said distributor means for returning said liquid solution to said reservoir means.

9. Apparatus as described in claim 8 wherein said collector means includes weir means for establishing the height of the liquid solution within said container means above the miniature circuits.

10. Apparatus as described in claim 1 wherein said means for applying a voltage between the liquid solution and said electrodes includes:

pulse generator means, and anode means disposed in said container means below said holder means.

11. Apparatus as described in claim 10 wherein said pulse generator means comprises bipolar pulse generator means for generating an adjustable frequency, adjustable pulse-width wave train.

12. Apparatus as described in claim 11 further including an array of isolating amplifier means coupled in parallel to said bipolar generator means and in series to respective ones of said electrodes.

13. Apparatus as described in claim 1 wherein the recognition of the presence or absence of the constituent on the conductor is based upon consequent changes in the optical reflectivity of the conductors, said apparatus further including light source means for reflecting consequent variable light from said conductors into the operator's eye.

* * * * *